(12) United States Patent
Jensen et al.

(10) Patent No.: US 12,394,757 B2
(45) Date of Patent: *Aug. 19, 2025

(54) SEMICONDUCTOR DEVICES WITH REDISTRIBUTION STRUCTURES CONFIGURED FOR SWITCHABLE ROUTING

(71) Applicant: Micron Technology, Inc., Boise, ID (US)

(72) Inventors: Travis M. Jensen, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 42 days.

This patent is subject to a terminal disclaimer.

(21) Appl. No.: 18/486,950

(22) Filed: Oct. 13, 2023

(65) Prior Publication Data

US 2024/0055411 A1 Feb. 15, 2024

Related U.S. Application Data

(63) Continuation of application No. 17/521,173, filed on Nov. 8, 2021, now Pat. No. 11,791,316, which is a
(Continued)

(51) Int. Cl.
  *H01L 25/065* (2023.01)
  *H01L 25/00* (2006.01)

(52) U.S. Cl.
  CPC .......... *H01L 25/0657* (2013.01); *H01L 25/50* (2013.01); *H01L 2225/0651* (2013.01);
  (Continued)

(58) Field of Classification Search
  CPC ................. H01L 25/0657; H01L 25/25; H01L 2225/0651; H01L 2225/06513;
  (Continued)

(56) References Cited

U.S. PATENT DOCUMENTS 10,115,709 B1 10/2018 Sasaki et al.
11,171,121 B2 * 11/2021 Jensen .................... H01L 25/50
(Continued)

FOREIGN PATENT DOCUMENTS

KR 20170075125 A 7/2017

OTHER PUBLICATIONS

Notice of Reasons for Rejection mailed Feb. 19, 2024 for Korean Patent Application No. 10-2022-7035642, 20 pages (with translation).

(Continued)

*Primary Examiner* — Jasmine J Clark
(74) *Attorney, Agent, or Firm* — Dorsey & Whitney LLP

(57) ABSTRACT

Semiconductor devices having redistribution structures, and associated systems and methods, are disclosed herein. In one embodiment, a semiconductor package includes a first semiconductor die including a first redistribution structure and a second semiconductor die including a second redistribution structure. The first and second semiconductor dies can be mounted on a package substrate such that the first and second redistribution structures are aligned with each other. In some embodiments, an interconnect structure can be positioned between the first and second semiconductor dies to electrically couple the first and second redistribution structures to each other. The first and second redistribution structures can be configured such that signal routing between the first and second semiconductor dies can be altered based on the location of the interconnect structure.

20 Claims, 8 Drawing Sheets

Related U.S. Application Data continuation of application No. 16/836,283, filed on Mar. 31, 2020, now Pat. No. 11,171,121.

(52) U.S. Cl.
CPC ............... *H01L 2225/06513* (2013.01); *H01L 2225/06527* (2013.01); *H01L 2225/06586* (2013.01)

(58) Field of Classification Search
CPC . H01L 2225/06527; H01L 2225/06586; H01L 23/525; H01L 24/02; H01L 2224/0235; H01L 2224/02375; H01L 2224/02379; H01L 2224/0401; H01L 2224/04042; H01L 2224/05117; H01L 2224/05138; H01L 2224/05155
USPC ........................................................ 257/777
See application file for complete search history.

(56) References Cited

U.S. PATENT DOCUMENTS

| | | |
|---|---|---|
| 2004/0251529 A1 | 12/2004 | Lee et al. |
| 2006/0194366 A1 | 8/2006 | Lee et al. |
| 2007/0170575 A1 | 7/2007 | Lee et al. |
| 2010/0289139 A1 | 11/2010 | Chen et al. |
| 2014/0339704 A1 | 11/2014 | Ahn et al. |
| 2016/0086921 A1 | 3/2016 | Cho |
| 2017/0084583 A1 | 3/2017 | Lin et al. |
| 2019/0198486 A1 | 6/2019 | Kim et al. |
| 2019/0304955 A1 | 10/2019 | Sasaki et al. |
| 2021/0280539 A1* | 9/2021 | Yang .................... H01L 23/3128 |
| 2021/0305211 A1 | 9/2021 | Jensen et al. |
| 2022/0059509 A1 | 2/2022 | Jensen et al. |

OTHER PUBLICATIONS

International Application No. PCT/US2021/020549—PCT International Search Report and Written Opinion, mailed Jun. 14, 2021, 17 pages.

KR Patent Application No. 10-2022-7035642—Korean Notice of Allowance, issued Sep. 25, 2024, with English Translation, 5 pages.

* cited by examiner

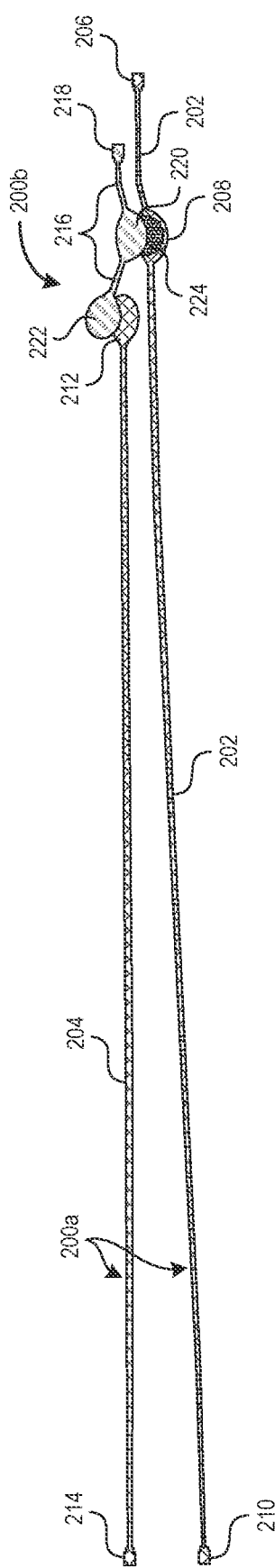
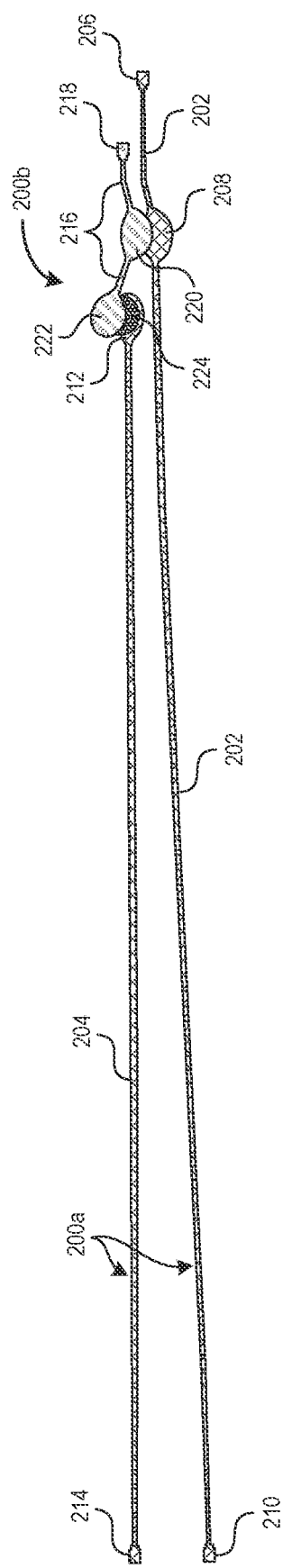
FIG. 2A
FIG. 2B

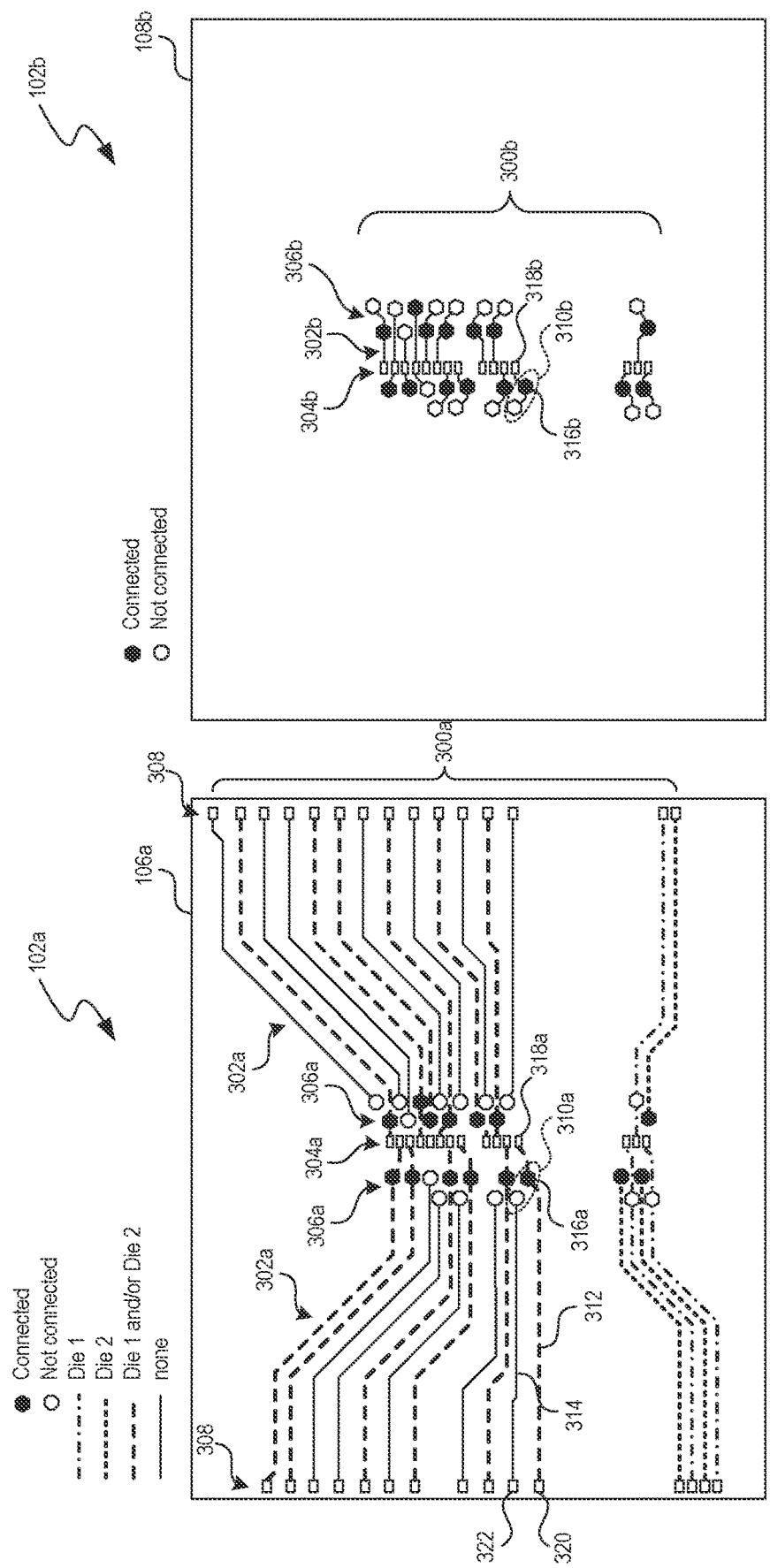

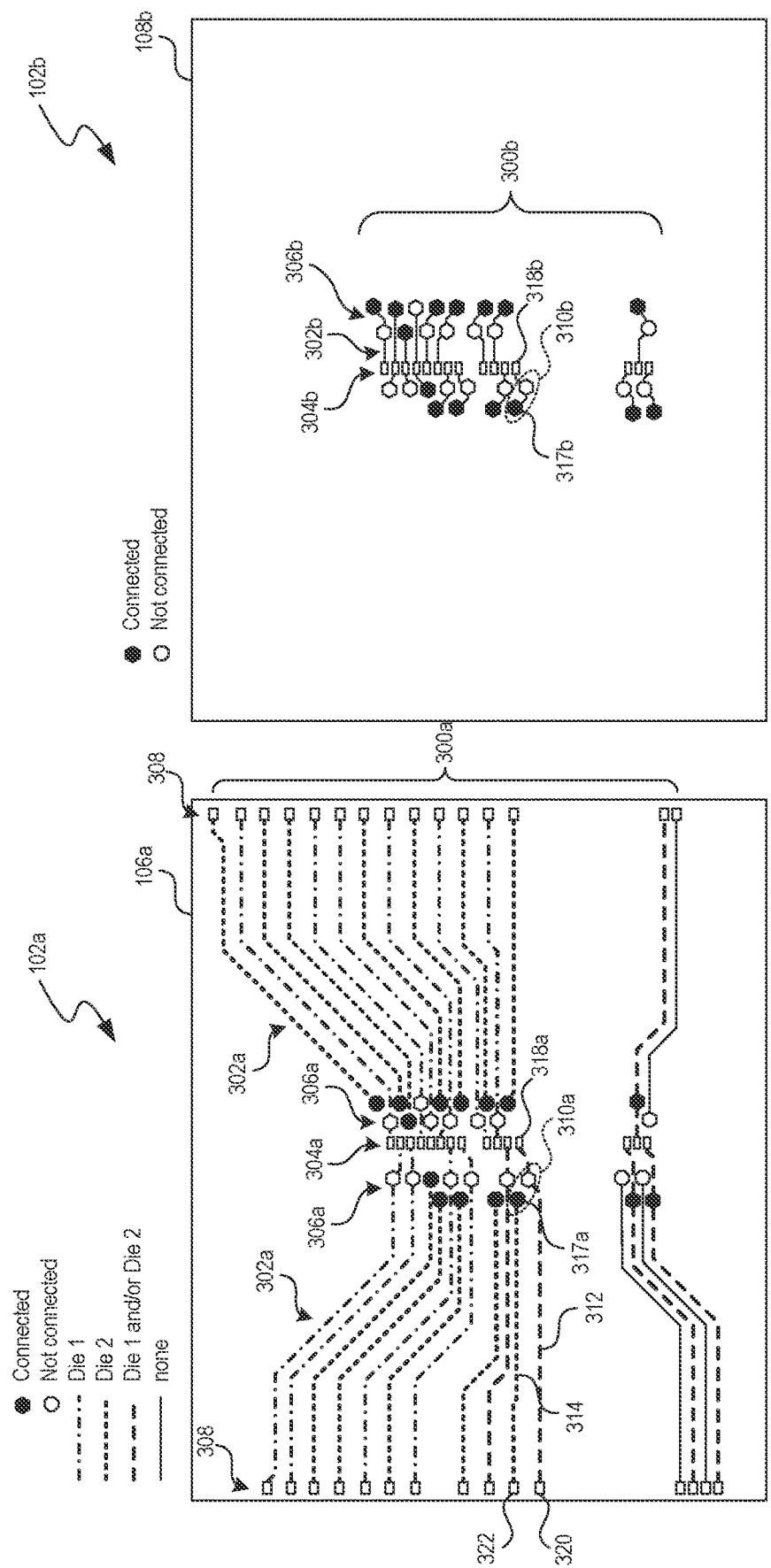

SEMICONDUCTOR DEVICES WITH REDISTRIBUTION STRUCTURES CONFIGURED FOR SWITCHABLE ROUTING

CROSS-REFERENCE TO RELATED APPLICATION(S)

This application is a continuation of U.S. application Ser. No. 17/521,173, filed Nov. 8, 2021, now U.S. Pat. No. 11,791,316; which is a continuation of U.S. application Ser. No. 16/836,283, filed Mar. 31, 2020, now U.S. Pat. No. 11,171,121; which are incorporated herein by reference in their entirety.

TECHNICAL FIELD

The present technology generally relates to semiconductor devices, and more particularly relates to semiconductor devices having redistribution structures configured to accommodate different package designs.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically stacked packages can be electrically coupled to each other and/or to a substrate via wires, interconnects, or other conductive structures. However, conventional structures and techniques for interconnecting vertically stacked semiconductor dies may not be able to accommodate different semiconductor package designs.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIGS. 2A and 2B are perspective views of a first redistribution structure and a second redistribution structure configured for use with different package designs in accordance with embodiments of the present technology.

FIGS. 4A and 4B illustrate signal routing through the first and second semiconductor dies of FIGS. 3A and 3B, respectively, in a first package design configured in accordance with embodiments of the present technology.

FIGS. 5A and 5B illustrate signal routing through the first and second semiconductor dies of FIGS. 3A and 3B, respectively, in a second package design configured in accordance with embodiments of the present technology.

DETAILED DESCRIPTION

Figure 1:
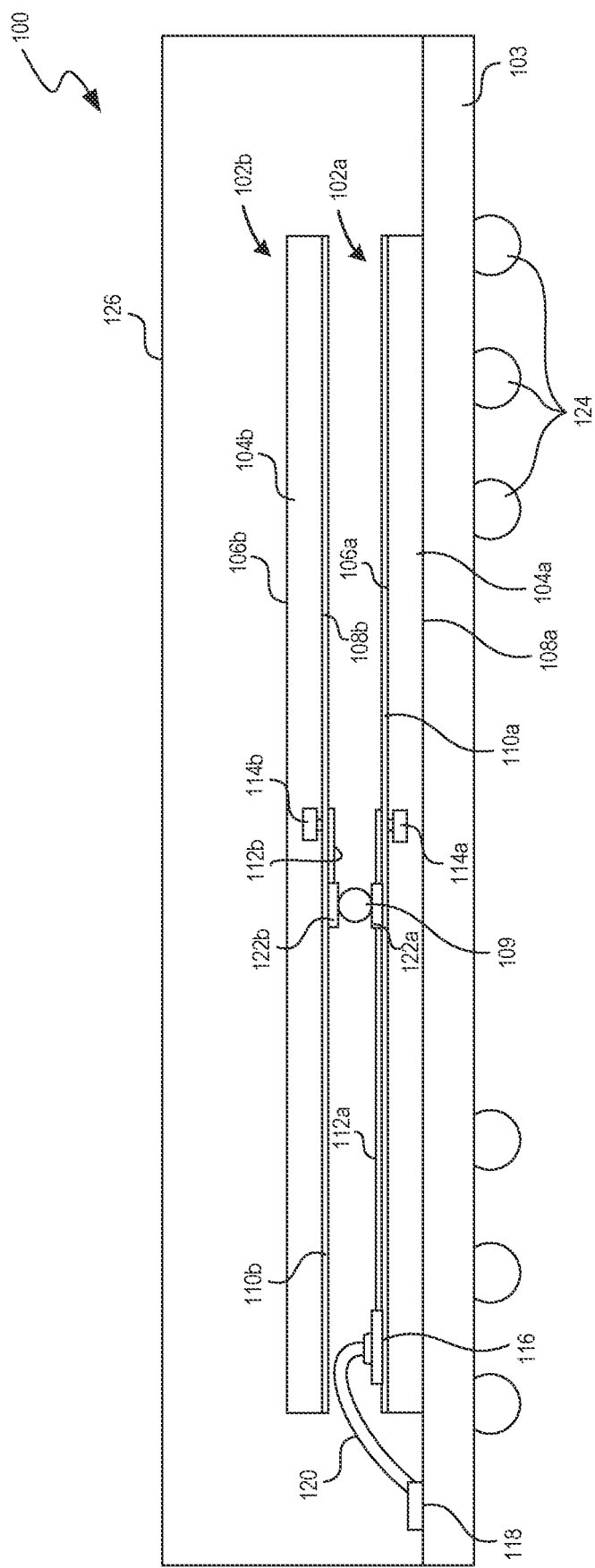
FIG. 1 is a side cross-sectional view of a semiconductor package configured in accordance with embodiments of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In several of the embodiments described below, a semiconductor package configured in accordance with the present technology includes a first semiconductor die including a first redistribution structure and a second semiconductor die including a second redistribution structure. The first and second semiconductor dies can be mounted on a substrate in a face-to-face (F2F) configuration such that at least some components of the first redistribution structure are aligned with corresponding components of the second redistribution structure. The semiconductor package can further include at least one interconnect structure (e.g., a solder bump) between the first and second redistribution structures to electrically couple the first and second semiconductor dies to each other.

In some embodiments, the first and second redistribution structures are each configured to be compatible with multiple package designs (e.g., ×4, ×8, and/or ×16 package designs). The location of the interconnect structure(s) can be used to switch or otherwise alter the routing of signals through the first and second redistribution structures to accommodate these different package designs. Accordingly, rather than requiring different redistribution structure designs for different packages, the present technology may allow the same redistribution structure designs to be used in different packages simply by varying the layout of the interconnect structures. The present technology can thus be desirable for reducing costs and supply chain complexity, and improving efficiency and flexibility of the design and manufacturing process.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-7. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a side cross-sectional view of a semiconductor package 100 ("package 100") configured in accordance with embodiments of the present technology. The package 100 can include a first semiconductor die 102a and a second semiconductor die 102b disposed over a package substrate 103. The first and second semiconductor dies 102a-b can each include a respective semiconductor substrate 104a-b (e.g., a silicon substrate, a gallium arsenide substrate, an organic laminate substrate, etc.) having a respective upper side or surface 106a-b and a respective lower side or surface 108a-b. In some embodiments, the first and second semiconductor dies 102a-b are vertically arranged with the second semiconductor die 102b mounted on the first semiconductor die 102a such that the lower surface 108b of the second semiconductor die 102b faces the upper surface 106a of the first semiconductor die 102a. The first semiconductor die 102a can be mounted on the package substrate 103 such that the lower surface 108a of the first semiconductor die 102a faces and is coupled to the package substrate 103.

In some embodiments, at least one of the surfaces of each of the first and second semiconductor dies 102a-b is an active surface including various types of semiconductor components, such as memory circuits, (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features. The first and second semiconductor dies 102a-b can be mounted such that the active surfaces of the semiconductor dies 102a-b face each other (e.g., a F2F configuration). For example, in the illustrated embodiment, the upper surface 106a of the first semiconductor die 102a and the lower surface 108b of the second semiconductor die 102b are active surfaces.

The first and second semiconductor dies 102a-b can be coupled (e.g., mechanically, thermally, and/or electrically) to each other by at least one interconnect structure 109 (e.g., bumps, micro-bumps, pillars, columns, studs, etc.—a single interconnect structure is shown in FIG. 1 merely for purposes of clarity). Each interconnect structure 109 can be formed of any suitably conductive material such as copper, nickel, gold, silicon, tungsten, solder (e.g., SnAg-based solder), conductive-epoxy, combinations thereof, etc., and can be formed by electroplating, electroless-plating, or another suitable process. In some embodiments, the interconnect structure 109 can also include barrier materials (e.g., nickel, nickel-based intermetallic, and/or gold) formed over end portions of the interconnect structure 109. The barrier materials can facilitate bonding and/or prevent or at least inhibit the electromigration of copper or other metals used to form the interconnect structure 109. Optionally, the interconnect structure 109 can be surrounded by an underfill material (not shown).

The package substrate 103 can be or include an interposer, such as a printed circuit board, a dielectric spacer, another semiconductor die (e.g., a logic die), or another suitable substrate. In some embodiments, the package substrate 103 includes additional semiconductor components (e.g., doped silicon wafers or gallium arsenide wafers), nonconductive components (e.g., various ceramic substrates, such as aluminum oxide (Al2O3), etc.), aluminum nitride, and/or conductive portions (e.g., interconnecting circuitry, through-silicon vias (TSVs), etc.). The package substrate 103 can further include electrical connectors 124 (e.g., solder balls, conductive bumps, conductive pillars, conductive epoxies, and/or other suitable electrically conductive elements) electrically coupled to the package substrate 103 and configured to electrically couple the package 100 to external devices or circuitry (not shown).

The package 100 can further include a mold material 126 formed over the package substrate 103 and/or at least partially around the first and second semiconductor dies 102a-b. The mold material 126 can be a resin, epoxy resin, silicone-based material, polyimide, or any other material suitable for encapsulating the first and second semiconductor dies 102a-b and/or at least a portion of the package substrate 103 to protect these components from contaminants and/or physical damage. In some embodiments, the semiconductor package 100 includes other components such as external heatsinks, a casing (e.g., thermally conductive casing), electromagnetic interference (EMI) shielding components, etc.

In some embodiments, the first and second semiconductor dies 102a-b each include a respective redistribution layer or structure. For example, as shown in FIG. 1, the first semiconductor die 102a includes a first redistribution structure 110a formed on the upper surface 106a and the second semiconductor die 102b includes a second redistribution structure 110b formed on the lower surface 108b. The first and second redistribution structures 110a-b can each include one or more electrically conductive components, such as contacts, traces, pads, pins, wiring, circuitry, and the like. The components of the redistribution structures 110a-b can be made of any suitable conductive material, such as one or more metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the redistribution structures 110a-b are or include an in-line redistribution layer (iRDL). An iRDL can be formed in a front-end phase of manufacturing process (e.g., prior to a wafer probe test).

The first and second redistribution structures 110a-b can be configured to electrically couple different portions of an individual semiconductor die to route signals therebetween. For example, the first redistribution structure 110a can include a first signal trace 112a extending between and electrically coupling a first die contact or pin 114a and a package contact or pin 116. The first die contact 114a and the package contact 116 can be at different locations on the first semiconductor die 102a. For example, the first die contact 114a can be located at or near a central and/or interior portion of the first semiconductor die 102a, while the package contact 116 can be located at or near a peripheral portion of the first semiconductor die 102a. The package contact 116 can be electrically coupled to a corresponding bond pad 118 on the package substrate 103 via a conductive element such as a wire 120 (e.g., a wirebond). As a result, signals originating from the first semiconductor die 102a can be transmitted to the package substrate 103 via the first redistribution structure 110a (e.g., from the first die contact 114a through the first signal trace 112a, the package contact 116, the wire 120, and the bond pad 118 to the package substrate 103).

In the illustrated embodiment, the second semiconductor die 102b does not have any package contacts for direct coupling to the substrate 103. Instead, signals from the second semiconductor die 102b can be routed to the package substrate 103 indirectly via the first semiconductor die 102a, as described in greater detail below. In other embodiments, however, the second semiconductor die 102b can include one or more package contacts configured to directly connect to the package substrate 103 (e.g., via wirebonds) to allow for direct signal transmission between the second semiconductor die 102b and package substrate 103. Optionally, some signals from the second semiconductor die 102b can be transmitted to the package substrate 103 indirectly via the first semiconductor die 102a, while other signals can be transmitted directly to the package substrate 103.

In the embodiment of FIG. 1, the first and second redistribution structures 110a-b and interconnect structure 109 route signals from the second semiconductor die 102b to the first semiconductor die 102a and the package substrate 103. The first signal trace 112a of the first redistribution structure 110a can be connected to a first interconnect pad 122a (e.g., a bump pad). The first interconnect pad 122a can be at or near the central and/or interior portion of the first semiconductor die 102a, e.g., near the first die contact 114a. In some embodiments, the first interconnect pad 122a is located along the first signal trace 112a between the first die contact 114a and the package contact 116. The second redistribution structure 110b can include a second signal trace 112b extending between and electrically coupling a second die contact or pin 114b and a second interconnect pad 122b (e.g., a bump pad). The second die contact 114b and the second interconnect pad 122b can be located near each other, e.g., at or near the central and/or interior portion of the second semiconductor die 102b.

As shown in FIG. 1, when the first and second semiconductor dies 102a-b are vertically arranged in a F2F configuration, the first and second redistribution structures 110a-b can face each other such that the first and second interconnect pads 122a-b are aligned. The first and second interconnect pads 122a-b can be electrically coupled to each other via the interconnect structure 109. As a result, signals originating from the second semiconductor die 102b can be transmitted to the package substrate 103 via the first and second redistribution structures 110a-b (e.g., from the second die contact 114b through the second signal trace 112b, the second interconnect pad 122b, the interconnect structure 109, the first interconnect pad 122a, the first signal trace 112a, the package contact 116, the wire 120, and the bond pad 118 to the package substrate 103).

In some embodiments, the first and second redistribution structures 110a-b are configured to accommodate different types of semiconductor package designs. For example, the first and second redistribution structures 110a-b can be used with at least two different package designs, such as a ×4/×8 design and a ×16 design. In some embodiments, a ×4/×8 package provides 8 different data channels, while a ×16 design provides 16 different data channels. The different package designs can involve different signal routing between the die contacts of the first semiconductor die 102a, the die contacts of the second semiconductor die 102b, and the package contacts of the first semiconductor die 102a. In such embodiments, the signal routing between these components can be switched to a different configuration by changing the location(s) of the interconnect structure(s) 109 between the first and second redistribution structures 110a-b, rather than by changing the design of the first and second redistribution structures 110a-b.

FIGS. 2A and 2B are perspective views of a first redistribution structure 200a and a second redistribution structure 200b configured for use with different package designs in accordance with embodiments of the present technology. The first and second redistribution structures 200a-b can be incorporated in any of the embodiments described herein (e.g., as part of the first and second redistribution structures 110a-b described with respect to FIG. 1). For example, the first redistribution structure 200a can be formed on an upper surface of a first semiconductor die (e.g., a lower semiconductor die in a F2F semiconductor package—not shown) and the second redistribution structure 200b can be formed on a lower surface of a second semiconductor die (e.g., an upper semiconductor die in a F2F semiconductor package—not shown). In other embodiments, this configuration can be reversed, such that the second redistribution structure 200b is formed on the upper surface of the first semiconductor die and the first redistribution structure 200a is formed on the lower surface of the second semiconductor die.

Referring to FIGS. 2A and 2B together, the first redistribution structure 200a includes a first signal trace 202 and a second signal trace 204. The first signal trace 202 can electrically couple a first die contact 206, a first interconnect pad 208, and a first package contact 210. The second signal trace 204 can electrically couple a second interconnect pad 212 to a second package contact 214. In some embodiments, the first die contact 206 includes or is coupled to an output pin of the first semiconductor die (e.g., a data pin, an address pin, a control pin, etc.). The first interconnect pad 208 can be located along the first signal trace 202 between the first die contact 206 and the first package contact 210. The first and second package contacts 210, 214 can be configured to be electrically coupled to corresponding first and second bond pads of a package substrate (not shown) via wirebonding or other techniques known to those of skill in the art. The first die contact 206, first interconnect pad 208, and second interconnect pad 212 can be located at a first portion of the first semiconductor die (e.g., a central and/or interior portion) and the first and second package contacts 210, 214 can be located at a second, different portion of the first semiconductor die (e.g., a peripheral portion). In some embodiments, the first and second signal traces 202, 204 are spaced apart and/or electrically isolated from each other such that signals carried by the first signal trace 202 are not transmitted to the second signal trace 204, and vice-versa.

The second redistribution structure 200b includes a third signal trace 216. The third signal trace 216 can electrically couple a second die contact 218, a third interconnect pad 220, and fourth interconnect pad 222. In some embodiments, the second die contact 218 includes or is coupled to an output pin of the second semiconductor die (e.g., a data pin, an address pin, a control pin, etc.). The third interconnect pad 220 can be located along the third signal trace 216 between the second die contact 218 and the fourth interconnect pad 222. The second die contact 218, third interconnect pad 220, and fourth interconnect pad 222 can be located at a central and/or interior portion of the second semiconductor die. In some embodiments, the third signal trace 216 does not includes any package contacts or other components that directly connect to a package substrate.

When the first and second semiconductor dies are assembled in a F2F configuration, the first and second redistribution structures 200a-b can be positioned near each other such that one or portions of the first and second redistribution structures 200a-b are aligned and can be bridged by an interconnect structure 224. For example, in the illustrated embodiment, the first interconnect pad 208 of the first redistribution structure 200a is aligned with the third interconnect pad 220 of the second redistribution structure 200b, such that the first interconnect pad 208 and third interconnect pad 220 can be electrically and mechanically coupled to each other by interconnect structure 224. As can be seen in FIGS. 2A and 2B, the first interconnect pad 208 extends at least partially over the third interconnect pad 220 so that when viewed from directly above or below, the footprint of the first interconnect pad 208 at least partially overlaps the footprint of the third interconnect pad 220. Optionally, the central vertical axis of the first interconnect pad 208 can be collinear with or at least partially overlap the central vertical axis of the third interconnect pad 220. The second interconnect pad 212 of the first redistribution structure 200a can be aligned with the fourth interconnect pad 222 of the second redistribution structure 200b in a similar manner. In some embodiments, an interconnect structure 224 is used to electrically couple the first and second redistribution structures 200a-b to each other. The positioning of the interconnect structure 224 can be selected to create a desired signal routing path between the first die contact 206, second die contact 218, first package contact 210, and second package contact 214.

Referring to FIG. 2A, for example, in a first package design (e.g., a ×4 and/or ×8 package design), the interconnect structure 224 can electrically and mechanically couple the first signal trace 202 of the first redistribution structure 200a to the third signal trace 216 of the second redistribution structure 200b. In the illustrated embodiment, the interconnect structure 224 is positioned between the first interconnect pad 208 of the first redistribution structure 200a and the third interconnect pad 220 of the second redistribution structure 200b, thereby electrically coupling the first signal trace 202 to the third signal trace 216. As a result, signals from the first die contact 206 of the first semiconductor die and/or the second die contact 218 of the second semiconductor die are both transmitted to the first package contact 210.

In the illustrated embodiments of FIG. 2A, there is no interconnect structure between the second interconnect pad 212 of the first redistribution structure 200a and the fourth interconnect pad 222 of the second redistribution structure 200b, such that the second signal trace 204 of the first redistribution structure 200a remains electrically isolated from the third signal trace 216 of the second redistribution structure 200b. Accordingly, signals from the second die contact 218 of the second semiconductor die are not transmitted to the second package contact 214. In some embodiments, the second package contact 214 also does not receive any signals from the first semiconductor die because the second signal trace 204 is not connected to any die contacts on the first semiconductor die. As a result, the first package contact 210 can transmit signals from the first and/or second semiconductor dies, while the second package contact 214 remains unused.

Referring to FIG. 2B, in a second package design (e.g., a ×16 package design), the interconnect structure 224 can electrically and mechanically couple the second signal trace 204 of the first redistribution structure 200a to the third signal trace 216 of the second redistribution structure 200b. In the illustrated embodiment, the interconnect structure 224 is positioned between the second interconnect pad 212 of the first redistribution structure 200a and the fourth interconnect pad 222 of the second redistribution structure 200b, thereby electrically coupling the second signal trace 204 to the third signal trace 216. As a result, signals from the second die contact 218 of the second semiconductor die can be transmitted to the second package contact 214. In some embodiments, the second package contact 214 does not receive any signals from the first semiconductor die because the second signal trace 204 is not connected to any die contacts on the first semiconductor die.

In the illustrated embodiments of FIG. 2B, there is no interconnect structure between the first interconnect pad 208 of the first redistribution structure 200a and the third interconnect pad 220 of the second redistribution structure 200b, such that the first signal trace 202 of the first redistribution structure 200a remains electrically isolated from the third signal trace 216 of the second redistribution structure 200b. As a result, the first package contact 210 can receive signals from the first die contact 206 but not the second die contact 218. In such embodiments, the first package contact 210 can transmit signals from the first semiconductor die while the second package contact 214 can transmit signals from the second semiconductor die.

The first and second redistribution structures 200a-b can be configured in many different ways to achieve the package-dependent signal routing described herein. For example, although in FIGS. 2A and 2B the first interconnect pad 208 is between the first die contact 206 and the first package contact 210, in other embodiments the first die contact 206 can be between the first interconnect pad 208 and the first package contact 210. As another example, the locations of the first signal trace 202 and the second signal trace 204 can be interchanged, such that the first interconnect pad 208 of the first redistribution structure 200a is aligned with the fourth interconnect pad 222 of the second redistribution structure 200b, and the second interconnect pad 212 of the first redistribution structure 200a is aligned with the third interconnect pad 220 of the second redistribution structure 200b. Optionally, the first die contact 206 can be omitted and/or the second signal trace 204 can be electrically coupled to a die contact. In some embodiments, the first redistribution structure 200a includes additional signal traces (e.g., one, two, three, four, five, or more additional signal traces) each having a corresponding interconnect pad, and the second redistribution structure 200b can include a corresponding number of interconnect pads to allow the third signal trace 216 to be selectively connected to the additional signal traces based on the positioning of the interconnect structure 224.

Figure 3B:
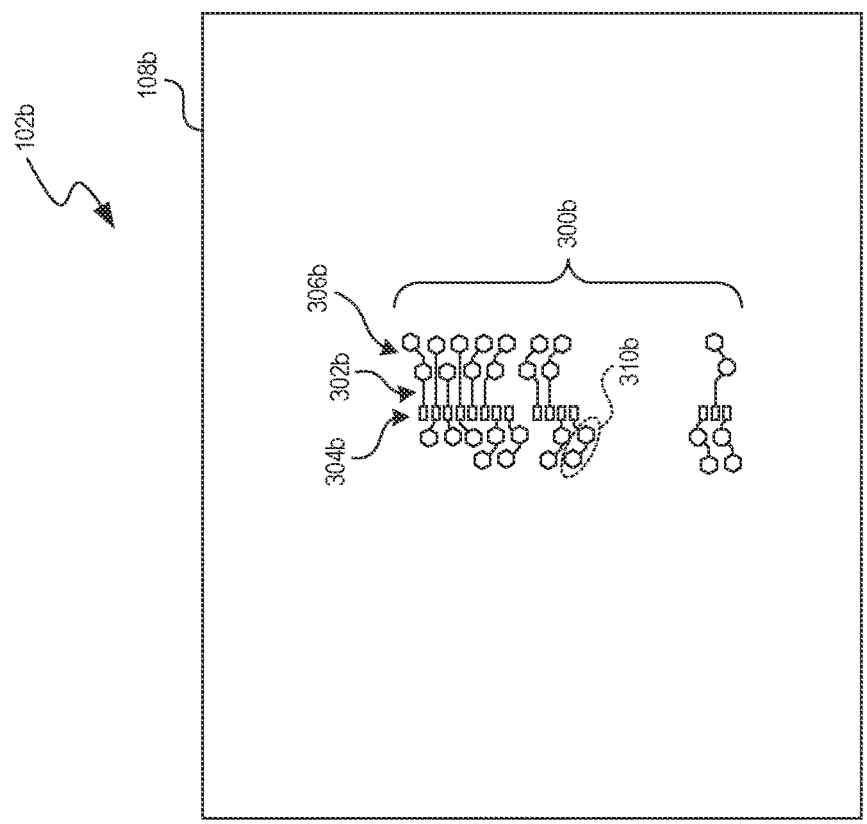
FIGS. 3A and 3B illustrate a first semiconductor die and a second semiconductor die, respectively, configured in accordance with embodiments of the present technology.
Figure 3A:
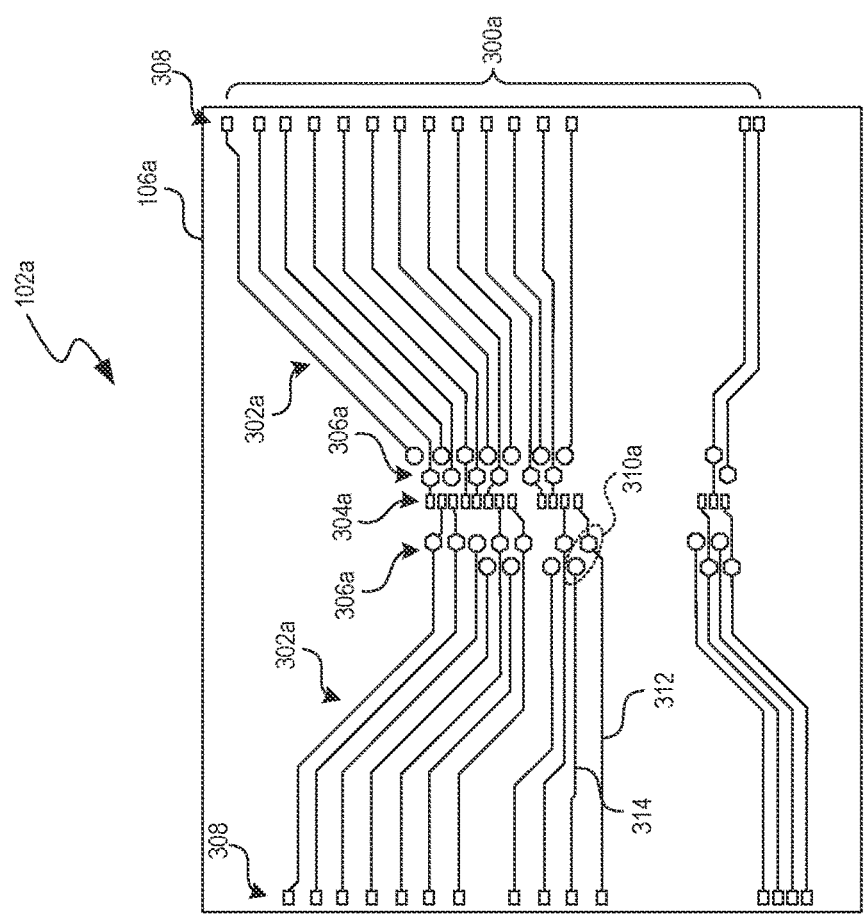

FIGS. 3A and 3B illustrate a first semiconductor die 102a and a second semiconductor die 102b configured in accordance with embodiments of the present technology. More specifically, FIG. 3A is a top view of the upper surface 106a of the first semiconductor die 102a and FIG. 3B is a top view of the lower surface 108b of the second semiconductor die 102b. As previously described, the first and second semiconductor dies 102a-b can be arranged in a F2F configuration in which the lower surface 108b of the second semiconductor die 102b is aligned with and positioned over the upper surface 106a of the first semiconductor die 102a. The first semiconductor die 102a includes a first redistribution structure 300a formed on the upper surface 106a and the second semiconductor die 102b includes a second redistribution structure 300b formed on the lower surface 108b. The first and second redistribution structures 300a-b can be generally similar to the corresponding structures previously described with respect to FIGS. 1-2B.

Referring to FIG. 3A, for example, the first redistribution structure 300a can include signal traces 302a, die contacts 304a, interconnect pads 306a, and package contacts 308. As can be seen in FIG. 3A, some signal traces 302a are connected to a respective die contact 304a, interconnect pad 306a, and package contact 308 (e.g., signal trace 312), while other signal traces 302a are connected to a respective interconnect pad 306a and package contact 308 but not to any of the die contacts 304a (e.g., signal trace 314). The signal traces 302a can be spaced apart and/or electrically isolated from each other so that signal transmission can occur independently along each signal trace 302a.

In the illustrated embodiment, the die contacts 304a are arranged in a single row along or near the central axis of the first semiconductor die 102a, and the interconnect pads 306a are arranged in multiple rows surrounding both sides of the row of die contacts 304a. The package contacts 308 can be arranged in two rows extending respectively along two of the lateral edges of the first semiconductor die 102a. Accordingly, the signal traces 302a can extend outwardly in two directions from the central portion of the semiconductor die to the peripheral portions to route signals from the die contacts 304a and/or interconnect pads 306a to the package contacts 308. In other embodiments, the first redistribution structure 300a can be configured differently (e.g., the die contacts 304a can be arranged in two or more rows, the package contacts 308 can be arranged in a single row along a single lateral edge of the first semiconductor die 102a, the interconnect pads 306a can be arranged in fewer or more rows, the interconnect pads 306a can be located on a single side of the row of die contacts 304a, etc.).

Referring to FIG. 3B, the second redistribution structure 300b can include signal traces 302b, die contacts 304b, and interconnect pads 306b. As can be seen in FIG. 3B, each signal trace 302b can be connected to a corresponding die contact 304b and at least two interconnect pads 306b. The signal traces 302b can be spaced apart and/or electrically isolated from each other so that signals can be transmitted independently along each signal trace 302b. In the illustrated embodiment, the second redistribution structure 300b does not include any package contacts for directly connecting to a package substrate. In other embodiments, however, the second redistribution structure 300b can include one or more package contacts for directly connecting to the package substrate.

In the illustrated embodiment, the die contacts 304b are arranged in a single row along or near the central axis of the second semiconductor die 102b, and the interconnect pads 306b are arranged in multiple rows surrounding both sides of the row of die contacts 304b. In other embodiments, the second redistribution structure 300b can be configured differently (e.g., the die contacts 304b can be arranged in two or more rows, the interconnect pads 306b can be arranged in fewer or more rows, the interconnect pads 306b can be located on a single side of the row of die contacts 304b, etc.).

The signal routing between the first and second semiconductor dies 102a-b via the first and second redistribution structures 300a-b can be switched or otherwise varied based on the positioning of interconnect structures (e.g., solder balls) between the first and second semiconductor dies 102a-b, as previously described with respect to FIGS. 2A and 2B. In some embodiments, the arrangement of the interconnect pads 306a of the first semiconductor die 102a can be identical or generally similar to the arrangement of the interconnect pads 306b of the second semiconductor die 102b. Thus, the first and second redistribution structures 300a-b can be bridged by interconnect structures positioned between interconnect pads 306a-b, as previously described.

Optionally, the interconnect pads 306a of the first redistribution structure 300a can be arranged in pairs (or larger groupings) to allow for switchable signal routing between the corresponding pairs of signal traces 302a, and the interconnect pads 306b of the second redistribution structure 300b can be arranged in corresponding pairs (or larger groupings) to align with the pairs of the first redistribution structure 300a. For example, a pair of interconnect pads 310a ("pair 310a") of the first redistribution structure 300a can be aligned with a corresponding pair of interconnect pads 310b ("pair 310b") of the second redistribution structure 300b to allow for switchable signal routing through a pair of signal traces 312, 314 of the first semiconductor die 102a.

FIGS. 4A and 4B illustrate signal routing through the first and second semiconductor dies 102a-b of FIGS. 3A and 3B, respectively, in a first package design (e.g., a ×4 and/or ×8 package design) configured in accordance with embodiments of the present technology. In the illustrated embodiment, some of the interconnect pads 306a-b are connected by interconnect structures (not shown) ("Connected"), while other interconnect pads 306a-b are not connected by any interconnect structures ("Not connected"). Depending on the arrangement of the interconnect structures, each signal trace 302a and package contact 308 can either: (1) receive signals from the first semiconductor die 102a and not the second semiconductor die 102b ("Die 1"), (2) receive signals from the second semiconductor die 102b and not the first semiconductor die 102a ("Die 2"), (3) receive signals either from the first and/or second semiconductor dies 102a-b ("Die 1 and/or Die 2"), or (4) not receive signals from either the first or second semiconductor dies 102a-b ("none").

For example, in the illustrated embodiment, a first interconnect pad 316a of pair 310a is connected to a second interconnect pad 316b of pair 310b by an interconnect structure (not shown), while the remaining interconnect pads of pairs 310a-b are not connected to each other. As a result, signals from die contact 318a of the first semiconductor die 102a and/or die contact 318b of the second semiconductor die 102 can both be transmitted to package contact 320 via signal trace 312, while signal trace 314 and package contact 322 remain unused and do not receive signals from either the first or second semiconductor dies 102a-b.

FIGS. 5A and 5B illustrate signal routing through the first and second semiconductor dies 102a-b of FIGS. 3A and 3B, respectively, in a second package design (e.g., a ×16 package design) configured in accordance with embodiments of the present technology. In the second package design, the locations of some or all the interconnect structures (not shown) can be different from the locations in the first package design. As a result, the signal routing for some or all of the signal traces 302a and package contacts 308 can be different from the routing in the first package design. For example, signal traces 302a and package contacts 308 that previously received signals from both the first and second semiconductor dies 102a-b can now receive signals from the first semiconductor die 102a only or the second semiconductor die 102b only; signal traces 302a and package contacts 308 that were previously unused can now receive signals from the first and/or second semiconductor dies 102a-b; and so on.

For example, in the illustrated embodiment, a second interconnect pad 317a of pair 310a is connected to a second interconnect pad 317b of pair 310b by an interconnect structure (not shown), while the remaining pairs interconnect pads of pairs 310a-b are not connected to each other. As a result, signal trace 312 and package contact 320 receive signals from die contact 318a of the first semiconductor die 102a, while signal trace 314 and package contact 322 receive signals from the die contact 318b of the second semiconductor die 102b.

The present technology can provide switchable routing of many different types of signals used in semiconductor packages, such as data signals, control signals, address signals, calibration signals, or any other signal type known to those of skill in the art. The connectivity and configuration of the signals can be varied as desired in a package-dependent manner in accordance with the techniques described herein.

Figure 6B:
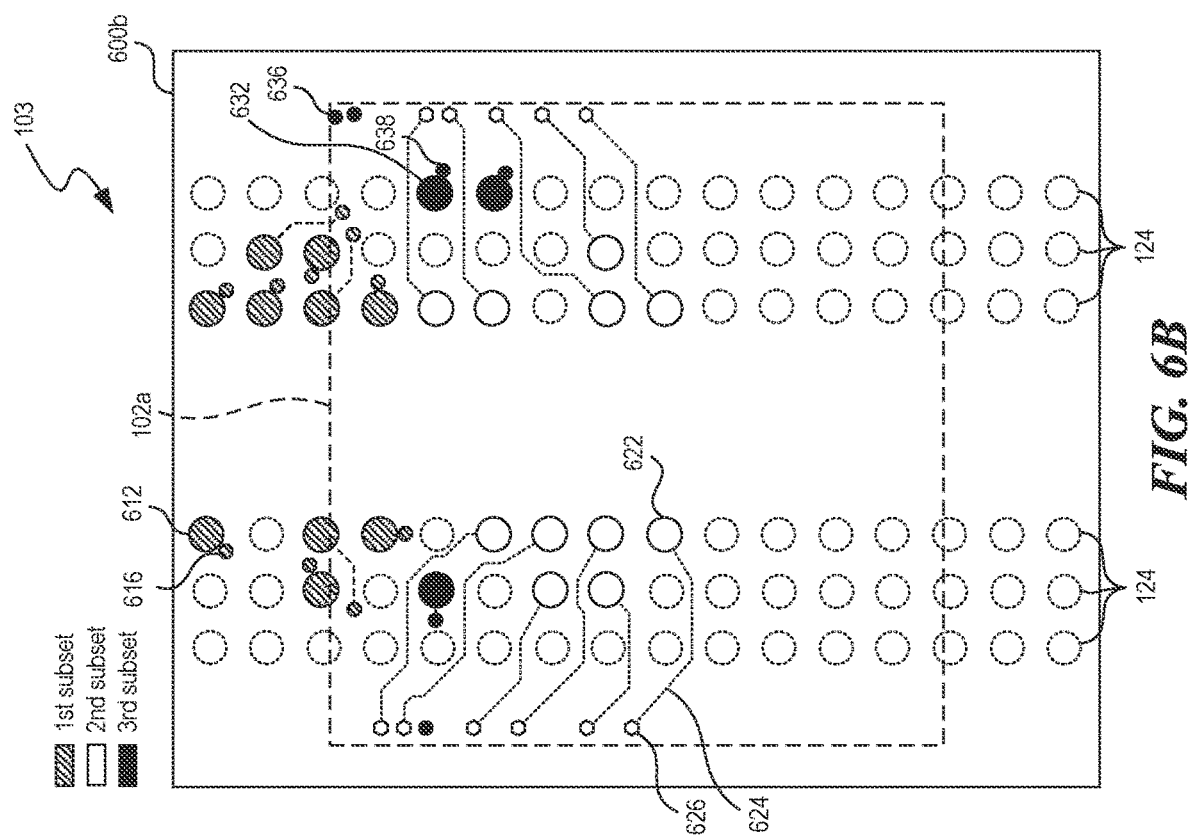
FIGS. 6A-6D illustrate signal routing through a package substrate configured in accordance with embodiments of the present technology.
Figure 6A:
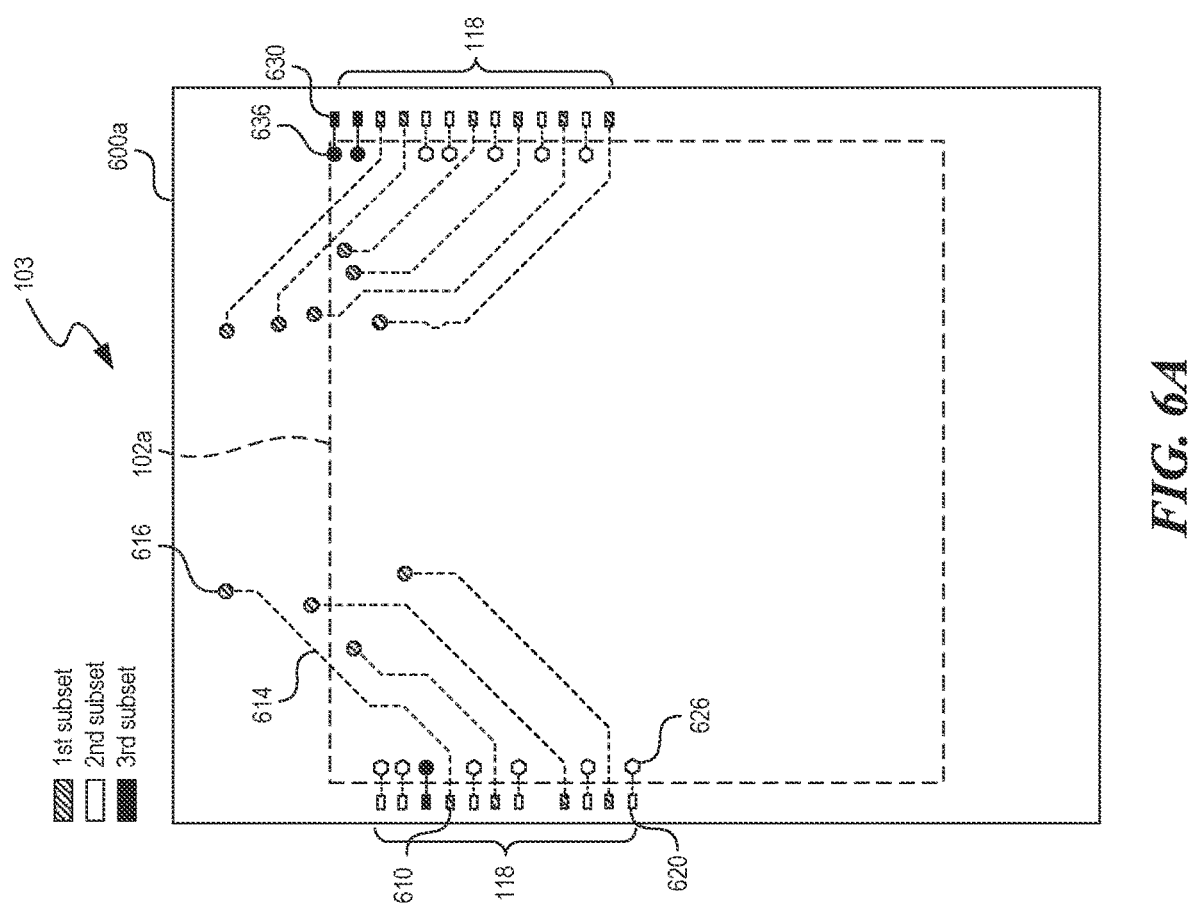
Figure 6D:
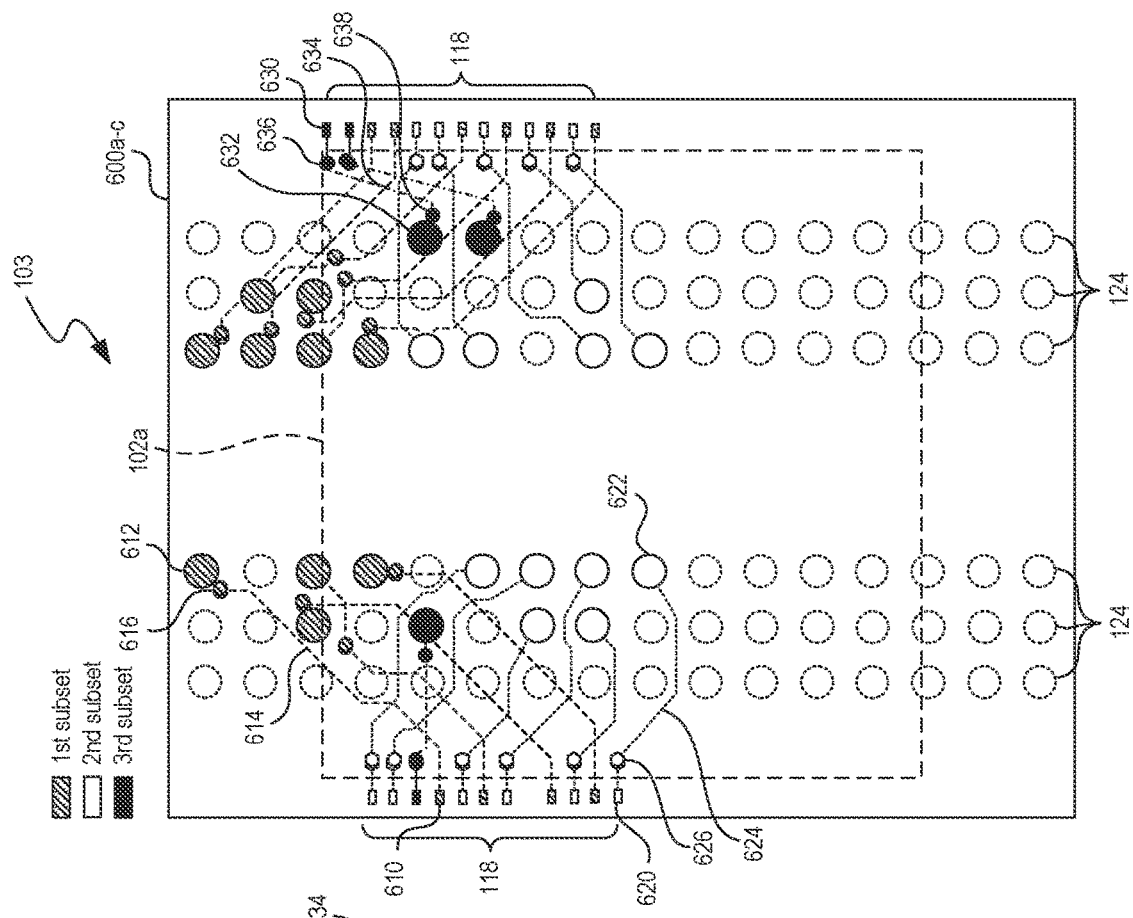
Figure 6C:
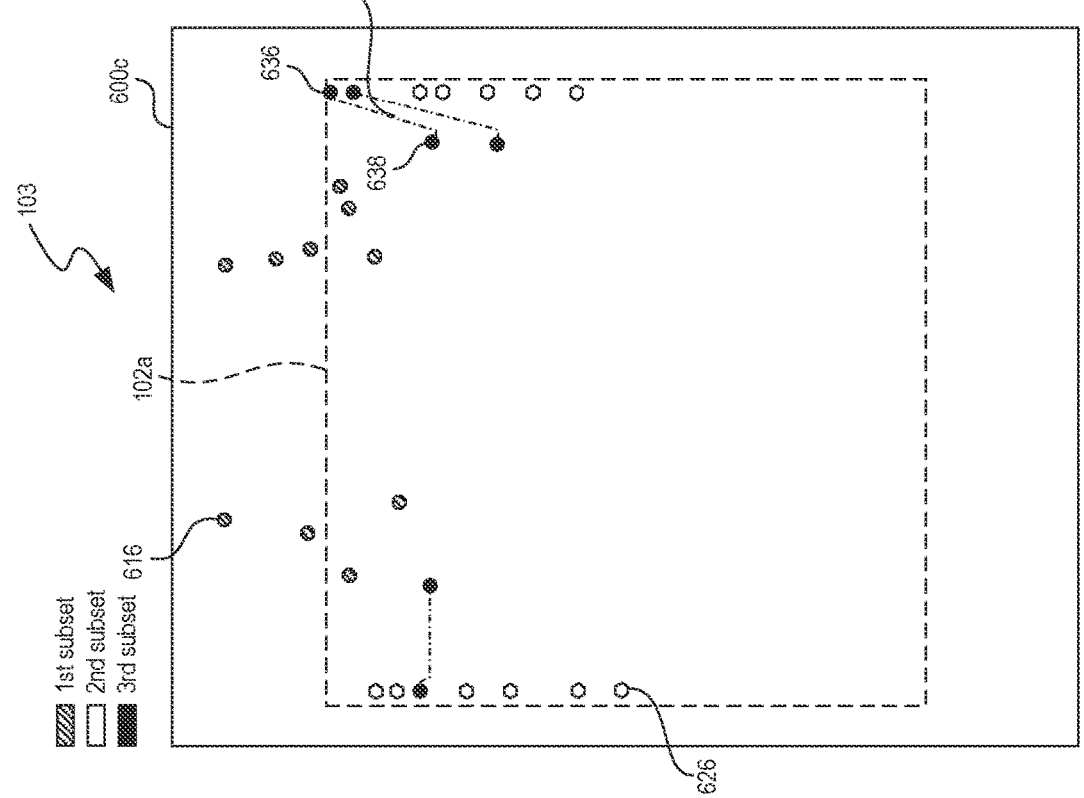

FIGS. 6A-6D illustrate signal routing through a package substrate 103 configured in accordance with embodiments of the present technology. More specifically, FIG. 6A is a top view of a first routing layer 600a of the package substrate 103, FIG. 6B is a top view of a second routing layer 600b of the package substrate 103, FIG. 6C is a top view of a third routing layer 600c of the package substrate 103, and FIG. 6D is a top view of the package substrate 103 with the routing layers 600a-c overlaid onto each other. The package substrate 103 can be incorporated in any embodiment of the semiconductor packages described herein (e.g., package 100 of FIG. 1).

The first routing layer 600a of the package substrate 103 can be electrically coupled to the lower surface of a first semiconductor die 102a (the outline of the first semiconductor die 102a is shown in FIGS. 6A-6D merely to illustrate the positioning relative to the package substrate 103). The second routing layer 600b can be electrically coupled to an array of electrical connectors 124 (e.g., a ball grid array—FIGS. 6B and 6D include outlines of the electrical connectors 124 merely to illustrate the positioning relative to the package substrate 103). As previously described with respect to FIG. 1, the electrical connectors 124 can be used to electrically couple the package substrate 103 to external devices or other higher-level components to allow signals to be transmitted thereto. In some embodiments, the package substrate 103 is electrically coupled to the first semiconductor die 102a via wires (not shown). The wires can connect package contacts (not shown) on the first semiconductor die 102a to corresponding bond pads 118 included in or electrically coupled to the first routing layer 600a of the package substrate 103. Each bond pad 118 can be electrically coupled to a corresponding electrical connector 124 via wiring, traces, metal layers or structures, vias, or other electrically conductive features extending along and/or through the routing layers 600a-c of the package substrate 103.

In some embodiments, the number and/or positioning of the bond pads 118 relative to the electrical connectors 124 can make it difficult or impossible to route all of the electrical interconnections between the bond pads 118 and electrical connectors 124 in a single layer of the package substrate 103. For example, the locations of the bond pads 118 may be constrained by the geometry of the first semiconductor die 102a. Signal routing through the package substrate 103 can become more congested and challenging as the width of the first semiconductor die 102a approaches the width of the array of electrical connectors 124. To ameliorate these issues, the package substrate 103 can route the electrical interconnections between the bond pads 118 and electrical connectors 124 over multiple layers (e.g., at least two, three, four, or more layers). For example, a first subset of signals from the bond pads 118 can be routed through the first routing layer 600a ("1st subset"), a second subset of signals can be routed through the second routing layer 600b ("2nd subset"), a third subset of signals can be routed through the third routing layer 600c ("3rd subset"), and so on.

In the illustrated embodiment, for example, the bond pads 118 include a first subset of bond pads 610, a second subset of bond pads 620, and, optionally, a third subset of bond pads 630 (reference numbers are shown only for a single example of each subset merely for purposes of clarity). In some embodiments, the first bond pads 610 correspond to a first set of data signals for the semiconductor package (e.g., the upper byte), the second bond pads 620 correspond to a second set of data signals (e.g., the lower byte), and the third bond pads 630 correspond to other signals (e.g., control signals, address signals, calibration signals, power signals, etc.). Each subset of the bond pads 118 can be electrically coupled to a corresponding subset of the array of electrical connectors 124 via respective wiring structures. For example, the first bond pads 610 can connect to a first subset of electrical connectors 612 via first wiring structures 614, the second bond pads 620 can connect to a second subset of electrical connectors 622 via second wiring structures 624, and, optionally, the third subset of bond pads 630 can connect to a third subset of electrical connectors 632 via wiring structures 634.

The signals from the first bond pads 610 can be routed in the first routing layer 600a. Accordingly, as shown in FIG. 6A, the first wiring structures 614 can be located in the first routing layer 600a, and can extend from the first bond pads 610 to respective first vias 616. In some embodiments, the first bond pads 610 are located at or near the peripheral portion of the package substrate 103, while the first vias 616 are located away from the first bond pads 610 at or near the interior portion of the package substrate 103. The first vias 616 can be located near the first electrical connectors 612 to provide electrical connections thereto. As shown in FIGS. 6A and 6B, for example, each of the first vias 616 can extend through the first routing layer 600a to a location in the second routing layer 600b adjacent or near the corresponding first electrical connector 612.

The signals from the second bond pads 620 can be routed in the second routing layer 600b, rather than in the first routing layer 600a. Accordingly, as shown in FIG. 6A, in the first routing layer 600a, the second bond pads 620 can be connected to respective second vias 626 that are located near the second bond pads 620 (e.g., near the peripheral portions of the package substrate 103). As shown in FIGS. 6A and 6B, the second vias 626 can extend through the first routing layer 600a to a location in the second routing layer 600b away from the corresponding second electrical connectors 622. The second wiring structures 624 can be located in the second routing layer 600b and can extend from the second vias 626 to the second electrical connectors 622.

Referring to FIGS. 6C together, the package substrate 103 can optionally include a third routing layer 600c between the first and second routing layers 600a-b. In such embodiments, the first vias 616 and second vias 626 can extend through the routing layer 600c. The third routing layer 600c can also be used for routing signals from the third bond pads 630. Accordingly, as shown in FIG. 6A, in the first routing layer 600a, the third bond pads 630 can be connected to third vias 626a that are located near the third bond pads 630 (e.g., near the peripheral portions of the package substrate 103). As shown in FIGS. 6A and 6C, the third vias 636 can extend through the first routing layer 600a and into the third routing layer 600c. The third wiring structures 634 can be located in the third routing layer 600c and can extend from the third vias 636 to fourth vias 638. The fourth vias 638 can be spaced apart from the third vias 636. As shown in FIGS. 6B and 6C, the fourth vias 638 can extend through the third routing layer 600c to a location in the second routing layer 600b adjacent or near the corresponding third electrical connectors 632.

FIG. 6D shows the package substrate 103 with the routing layers 600a-c overlaid onto each other. As can be seen from the illustrated embodiment, the use of multiple routing layers as described herein allows for numerous and complex interconnections between the bond pads 118 and the electrical connectors 124. In other embodiments, the package substrate 103 can include fewer or more routing layers (e.g., one, two, four, five, or more routing layers) each including respective wiring structures for routing signals between subsets of the bond pads 118 and the electrical connectors 124. The package substrate 103 can also include additional layers not shown in FIGS. 6A-6D. For example, the package substrate 103 can include one or more layers of insulating material between routing layers to reduce or prevent electrical interference. The package substrate 103 can also include one or more layers of material configured to provide structural support and/or mechanical strength.

Figure 7:
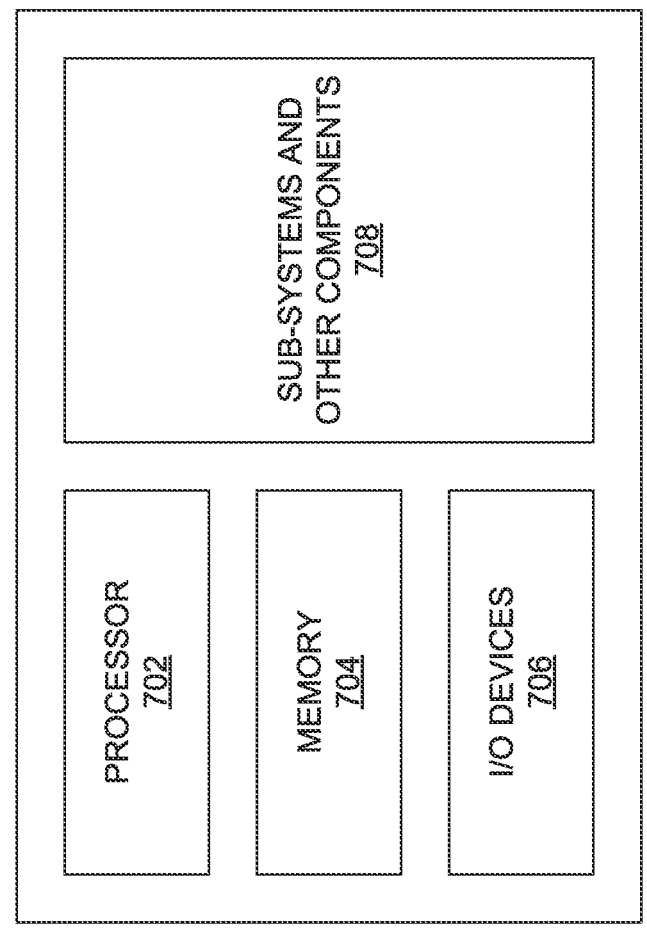
FIG. 7 is a schematic view of a system that includes a semiconductor device or package configured in accordance with embodiments of the present technology.

Any one of the semiconductor devices and/or packages having the features described above with reference to FIGS. 1-6D can be incorporated into any of a myriad of larger and/or more complex systems, a representative example of which is system 700 shown schematically in FIG. 7. The system 700 can include a processor 702, a memory 704 (e.g., SRAM, DRAM, flash, and/or other memory devices), input/output devices 706, and/or other subsystems or components 708. The semiconductor dies and/or packages described above with reference to FIGS. 1-6D can be included in any of the elements shown in FIG. 7. The resulting system 700 can be configured to perform any of a wide variety of suitable computing, processing, storage, sensing, imaging, and/or other functions. Accordingly, representative examples of the system 700 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 700 include lights, cameras, vehicles, etc. With regard to these and other example, the system 700 can be housed in a single unit or distributed over multiple interconnected units, e.g., through a communication network. The components of the system 700 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed is:

1. A method of manufacturing a semiconductor package, the method comprising:
forming a first redistribution structure on a first semiconductor die;
forming a second redistribution structure on a second semiconductor die; and
selecting, based on a design of the semiconductor package, either a first position or a second position for an interconnect structure between the first and second semiconductor dies, wherein:
the first position corresponds to the interconnect structure electrically coupling a contact of the second die through the first and second redistribution structures to a first package contact of the semiconductor package, and
the second position corresponds to the interconnect structure electrically coupling the contact of the second die through the first and second redistribution structures to a second package contact of the semiconductor package; and
electrically coupling the first and second semiconductor dies with the interconnect structure in the selected first or second position.

2. The method of claim 1 wherein the design is a ×4 and/or a ×8 package design and the method further comprises positioning the interconnect structure in the first position such that a contact of the first die is also electrically coupled to the first package contact.

3. The method of claim 2, further comprising transmitting a signal from one or more of the contact of the first die and the contact of the second die to the first package contact.

4. The method of claim 1 wherein the design is a ×16 package design and the method further comprises positioning the interconnect structure in the second position such that a contact of the first die contact is electrically coupled to the first package contact and the contact of the second die is electrically coupled to the second package contact.

5. The method of claim 4, further comprising:
transmitting a first signal from the contact of the first die to the first package contact; and
transmitting a second signal from the contact of the second die to the second package contact, wherein the second signal is different from the first signal.

6. The method of claim 1, further comprising:
mounting the first semiconductor die on a package substrate; and
mounting the second semiconductor die on the first semiconductor die.

7. The method of claim 6 wherein the first and second semiconductor dies are mounted in a face-to-face configuration.

8. The method of claim 6, further comprising wirebonding the first semiconductor die to the package substrate.

9. A method of manufacturing a semiconductor package, the method comprising:
 mounting a first semiconductor die to a package substrate, the first semiconductor die including:
  a first interconnect pad electrically coupled to both a first die contact of the first semiconductor die and a first package contact, and
  a second interconnect pad electrically coupled to a second package contact and electrically isolated from the first interconnect pad; and
 mounting a second semiconductor die to the first semiconductor die, the second semiconductor die including:
  a third interconnect pad and a fourth interconnect pad, both electrically coupled to a second die contact of the second semiconductor die,
 wherein either (1) the first interconnect pad is coupled to the third interconnect pad by a first interconnect structure to configure the semiconductor package for a first package configuration while the second interconnect pad is electrically isolated from the fourth interconnect pad, or (2) the second interconnect pad is coupled to the fourth interconnect pad by a second interconnect structure to configure the semiconductor package for a second package configuration while the first interconnect pad is electrically isolated from the third interconnect pad.

10. The method of claim 9 wherein the first package configuration has half as many data channels as the second package configuration.

11. The method of claim 9 wherein the first package configuration is a ×4 and/or a ×8 configuration and the second package configuration is a ×16 configuration.

12. The method of claim 9 wherein either the first interconnect structure or the second interconnect structure is comprised by a redistribution layer disposed between the first semiconductor die and the second semiconductor die.

13. A method of manufacturing a semiconductor package comprising:
 mounting a first semiconductor die to a package substrate, the first semiconductor die including:
  a first interconnect pad electrically coupled to both a first die contact of the first semiconductor die and a first package contact, and
  a second interconnect pad electrically coupled to a second package contact and electrically isolated from the first interconnect pad; and
 mounting a second semiconductor die to the first semiconductor die, the second semiconductor die including:
  a third interconnect pad and a fourth interconnect pad, both electrically coupled to a second die contact of the second semiconductor die,
 wherein (1) the first interconnect pad is vertically aligned with the third interconnect pad, and (2) the second interconnect pad is vertically aligned with the fourth interconnect pad, and
 wherein either (1) the first interconnect pad is coupled to the third interconnect pad by a first interconnect structure while the second interconnect pad is electrically isolated from the fourth interconnect pad, or (2) the second interconnect pad is coupled to the fourth interconnect pad by a second interconnect structure while the first interconnect pad is electrically isolated from the third interconnect pad.

14. The method of claim 13, wherein the first interconnect structure electrically couples the first interconnect pad to the third interconnect pad such that the first and second die contacts are both electrically coupled to the first package contact.

15. The method of claim 14 wherein the first interconnect structure is a solder bump.

16. The method of claim 13, wherein the second interconnect structure electrically couples the second interconnect pad to the fourth interconnect such that the first die contact is electrically coupled to the first package contact and the second die contact is electrically coupled to the second package contact.

17. The method of claim 16 wherein the second interconnect structure is a solder bump.

18. The method of claim 13 wherein:
 the first die contact, the first interconnect pad, and the second interconnect pad are at an interior portion of the first semiconductor die;
 the first and second package contacts are at a peripheral portion of the first semiconductor die; and
 the second die contact, the third interconnect pad, and the fourth interconnect pad are at an interior portion of the second semiconductor die.

19. The method of claim 13 wherein the first and second package contacts are electrically coupled to respective first and second bond pads on the package substrate via wire bonds.

20. The method of claim 19 wherein the package substrate is coupled to a first electrical connector and a second electrical connector, the first electrical connector is electrically coupled to the first bond pad, and the second electrical connector is electrically coupled to the second bond pad.

* * * * *